United States Patent [19]

Nicholson

[11] Patent Number: 5,668,408

[45] Date of Patent: Sep. 16, 1997

[54] PIN GRID ARRAY SOLUTION FOR MICROWAVE MULTI-CHIP MODULES

[75] Inventor: Dean B. Nicholson, Windsor, Calif.

[73] Assignee: Hewlett-Packard Company, Palo Alto, Calif.

[21] Appl. No.: 629,949

[22] Filed: Apr. 12, 1996

[51] Int. Cl.⁶ .................. H01L 23/04; H01L 23/12
[52] U.S. Cl. .............. 257/699; 257/704; 257/728; 361/742; 361/753; 361/799
[58] Field of Search ................ 257/659, 697, 257/698, 699, 704, 728; 361/742, 751, 753, 799

[56] References Cited

U.S. PATENT DOCUMENTS

| | | | |
|---|---|---|---|
| 4,410,902 | 10/1983 | Malik | 357/13 |
| 5,012,213 | 4/1991 | Tsai | 333/247 |
| 5,198,824 | 3/1993 | Poradish | 257/728 |
| 5,235,300 | 8/1993 | Chan et al. | 257/728 |
| 5,451,818 | 9/1995 | Chan et al. | 257/728 |
| 5,465,008 | 11/1995 | Goetz et al. | 257/728 |
| 5,479,319 | 12/1995 | Werther | 257/697 |
| 5,481,436 | 1/1996 | Werther | 257/697 |
| 5,513,076 | 4/1996 | Werther | 257/697 |
| 5,515,241 | 5/1996 | Werther | 257/697 |
| 5,567,984 | 10/1996 | Zalesinski et al. | 257/697 |
| 5,574,313 | 11/1996 | McKleroy | 257/728 |
| 5,574,314 | 11/1996 | Okada et al. | 257/698 |

FOREIGN PATENT DOCUMENTS 335432   12/1993   Japan ................... 257/728

OTHER PUBLICATIONS

Times Product and Literature Review, May 1993, p. 15.

Primary Examiner—Tom Thomas
Assistant Examiner—David Ostrowski
Attorney, Agent, or Firm—Pamela Lau Kee

[57] ABSTRACT

A module technology allows a PGA like package architecture to be used in microwave instruments and other high frequency systems where high isolation, low reflection, and low cost multi-chip modules are needed.

4 Claims, 7 Drawing Sheets

PIN GRID ARRAY SOLUTION FOR MICROWAVE MULTI-CHIP MODULES

FIELD OF THE INVENTION

The invention is directed towards the field of packaging of multi-chip modules. In particular, the invention is directed toward providing high isolation both between and along lines in microwave applications.

BACKGROUND OF THE INVENTION

Packaging of integrated circuits (ICs) for microwave test equipment requires a number of characteristics: high isolation is required between different functional blocks, low loss RF transmission paths need to be provided, and the final assembly must be low cost. Traditionally, routing of microwave signals has been done in instruments by coaxial cables with SMA connectors on the ends for frequencies below 20 GHz. However, in the last few years, many ICs operating up to 10 GHz have become cheaply available in plastic or ceramic surface mount packages for mounting on PC boards.

It would be convenient to have a packaging scheme that allows inexpensive, low loss, low reflection, high isolation transitions to either PC boards or SMA connectors. Additionally, it would be advantageous to increase the density of DC and RF connections to the outside world over the 5 mm pitch that has been the standard for microcircuits. A multi-chip module packaging system that addresses these issues is desired.

SUMMARY OF THE INVENTION

A module technology allows a PGA-like packaging assembly to be used in microwave instruments and other high frequency systems where high isolation, low reflection, and low cost multi-chip modules are needed. The packaging assembly includes a baseplate preform positioned between a baseplate and a circuit assembly having pins. The baseplate preform is made from a material that accommodates the differential thermal expansion between the baseplate material and the circuit assembly. A lid preform positioned between the circuit assembly and a lid also accommodates thermal expansion differences.

DETAILED DESCRIPTION OF THE PREFERRED EMBODIMENTS

The packaging scheme begins with a Pin Grid Array (PGA) package and then modifies it to achieve higher isolation and higher performance for the transitions on and off package.

Fundamental advantages of PGA architecture for multi-chip modules are the high density of interconnects it allows, and the ability to attach physically large modules to PC boards without having differential expansion of the module vs. the PC board be a problem due to the sideways flexure allowed by the PGA pins. These advantages are preserved in this scheme, but enhancements are made to give better frequency transitions into and out of the module, to better extract heat from the module, and to provide higher electrical isolation from one pin to another.

Figure 1:
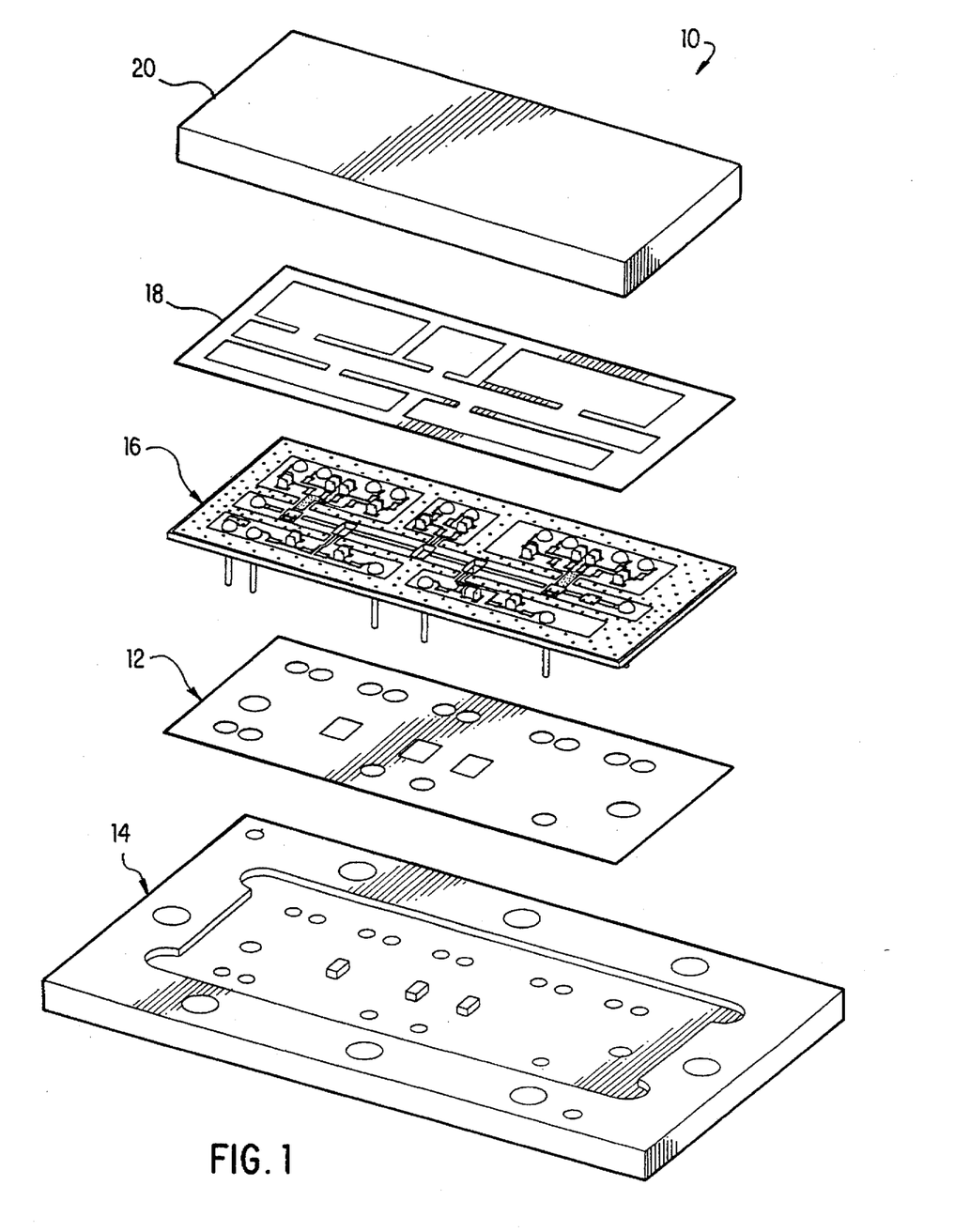
FIG. 1 illustrates a PGA-like solution for microwave instrumentation.

FIG. 1 illustrates an embodiment of the present invention. A packaging assembly 10 includes an electrically conductive adhesive baseplate preform 12 positioned between a baseplate 14 and a circuit assembly 16 having pins. The baseplate preform 12 provides a mechanical attachment between the baseplate and the circuit assembly while also electrically connecting their ground planes. The baseplate preform 12 also acts to accommodate the differential thermal expansion between the baseplate 14 and the circuit assembly 16. An electrically conductive, mechanically adhesive lid preform 18 is positioned between the circuit assembly 16 and a lid 20 to mechanically and electrically attach these two parts and accommodate the differential thermal expansion between them.

In the preferred embodiment, the baseplate is a metal ground plane that electrically isolates the pins of the circuit assembly. The pins of the circuit assembly are thus surrounded by a metal ground plane to provide a coaxial airline structure which eliminates the inductance associated with bare pins.

The dimensions of the ground plane hole diameter may be optimized to minimize reflection to high frequencies for transitions to either a PC board or an SMA connector. In this embodiment, the pins were chosen to be a 0.020" diameter because it is a commercially available PGA size and is also the proper diameter to mate with an SMA connector. The pins are electrically and mechanically connected to the circuit on the top side of the substrate to allow greater clearance between the hole through the metal ground and the pin. A slightly greater diameter shoulder (~0.028" diameter) can be used to set the pin protrusion through the substrate without affecting this clearance significantly. The substrate is a 0.025" thick alumina substrate, but thicker or thinner alumina may be used, as may other ceramics or even organic PC boards. The coaxial airline structure also has excellent electrical isolation, eliminating another drawback of the standard PGA package.

Figure 2:
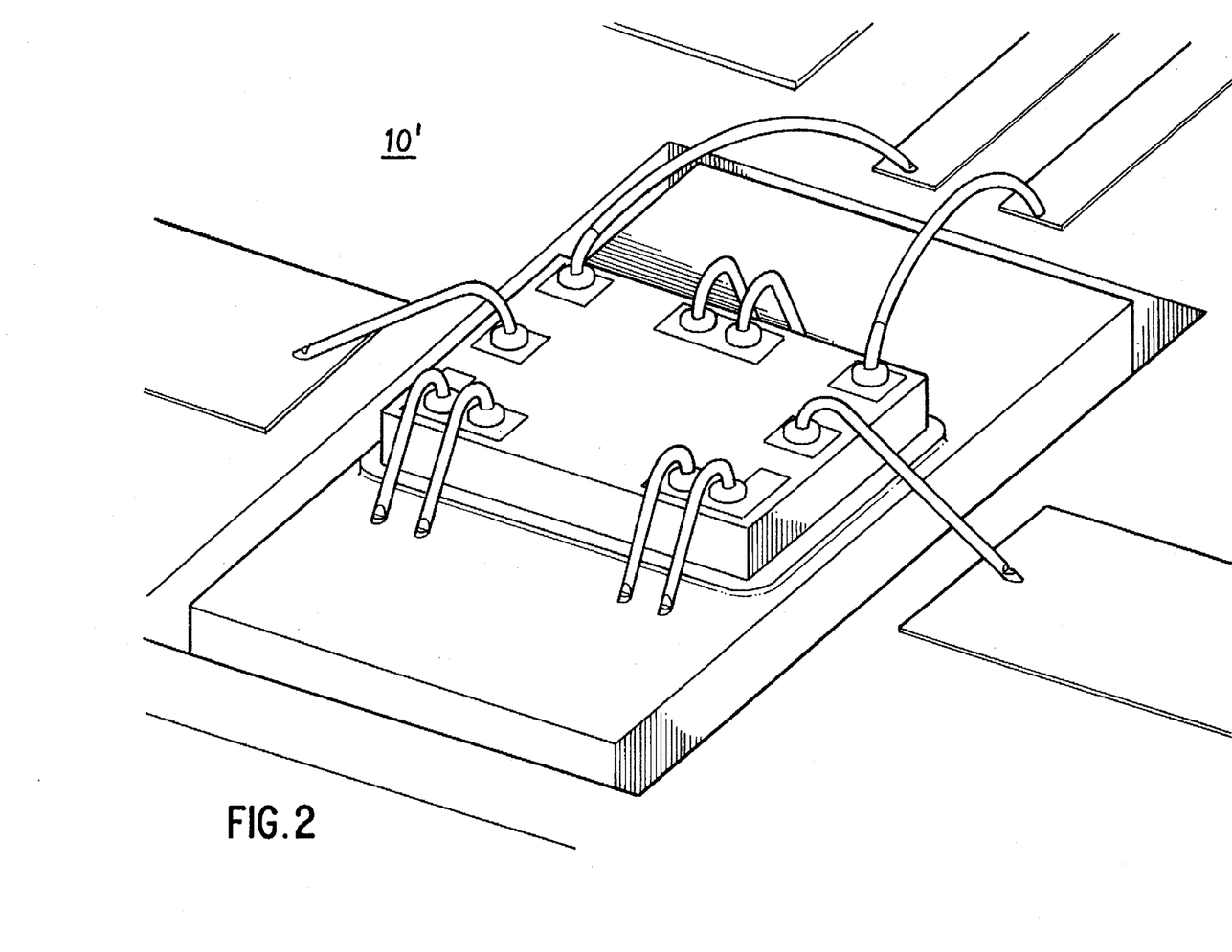
FIG. 2 illustrates a low inductance PGA-like solution.

FIG. 2 illustrates a low inductance embodiment. Where a very low inductance electrical ground is needed, or where an IC is located that is dissipating significant amounts of heat, the alumina substrate is laser machined away and the IC can be attached directly to a metal pedestal machined into the base plate.

Figure 3A:
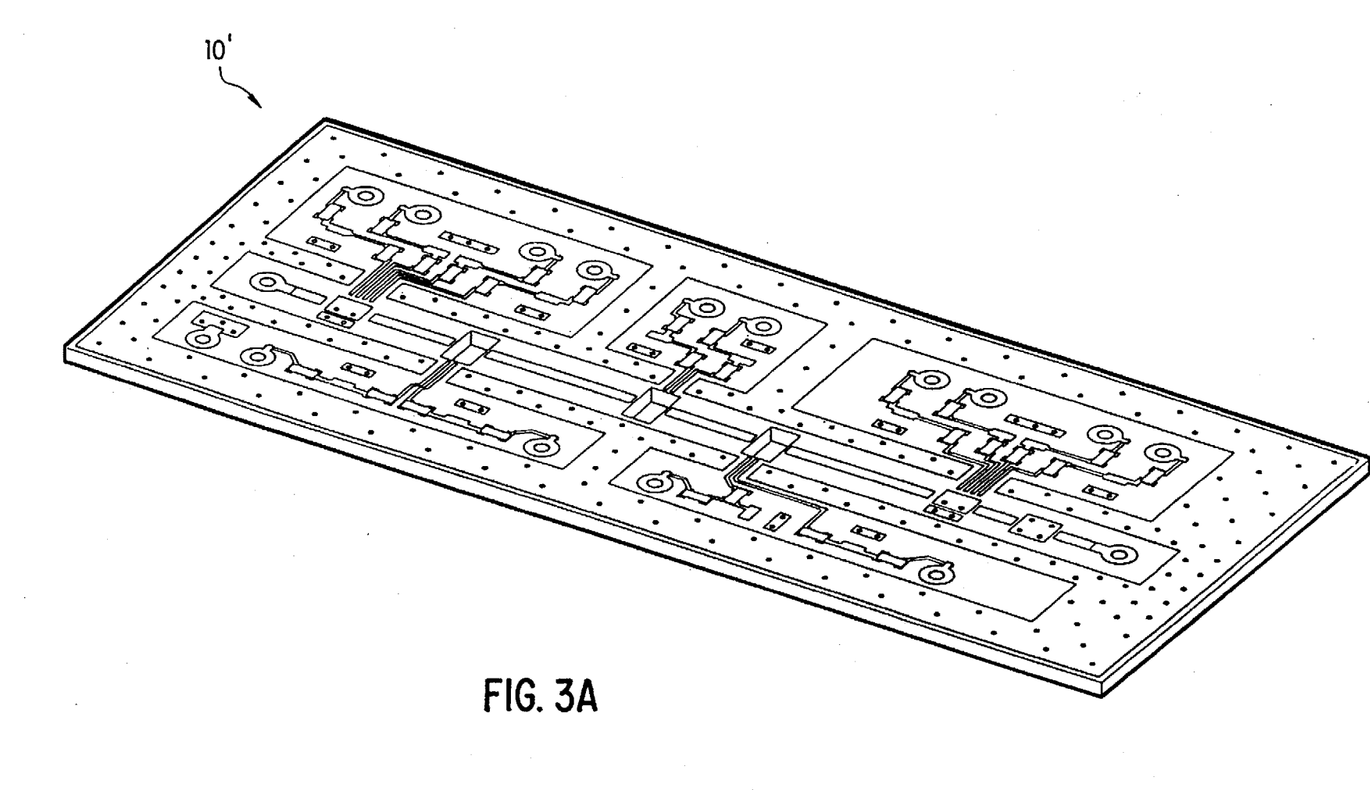
FIGS. 3A-B illustrate a multiple isolation PGA-like solution.
Figure 3B:
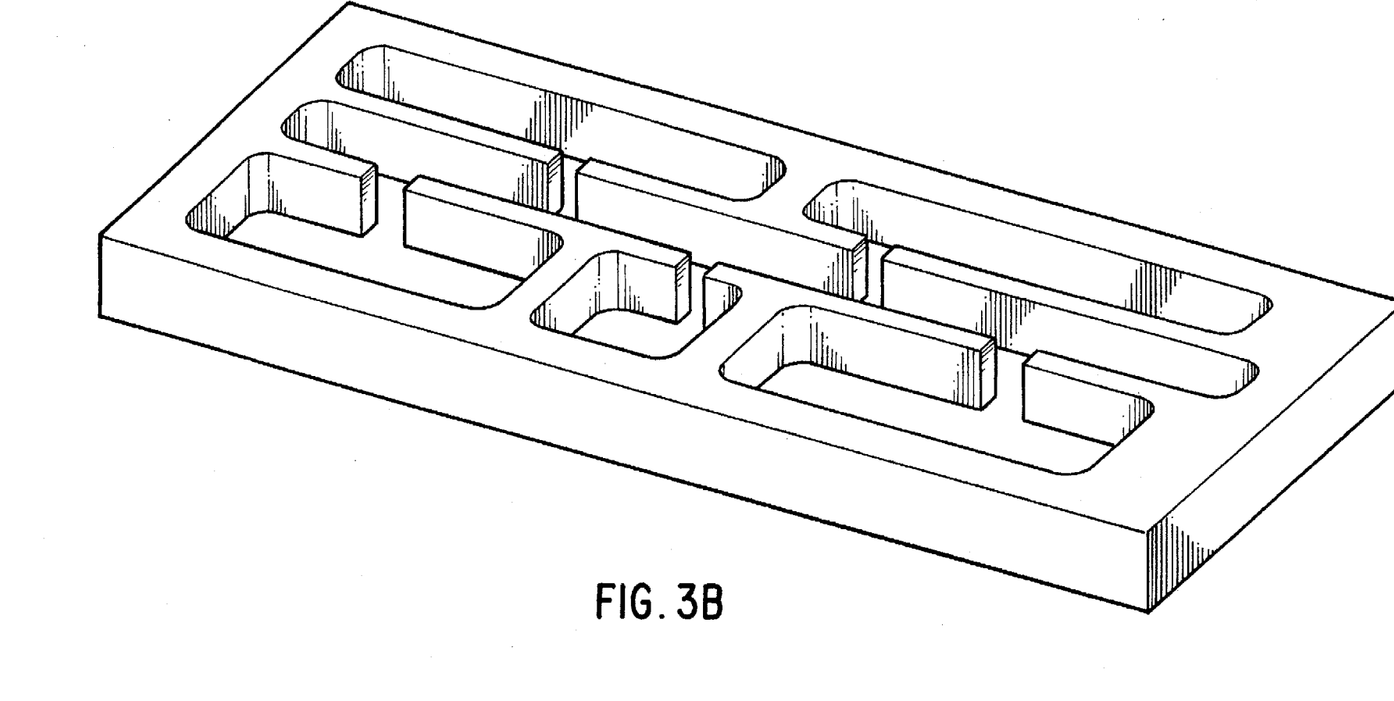

FIGS. 3A and 3B illustrate a multiple isolation embodiment. FIG. 3A illustrates the circuit assembly 16 having conductive vias to the top. FIG. 3B is bottom view of the lid 20 that shows cavities for electrical isolation. To achieve high isolation between different regions of the circuit, and to provide a good electrical ground for the lid, holes are laser machined into the alumina (0.008" diameter typical) and filled with a good conductor to bring the ground plane up to the top of the substrate. When the lid 20 is attached, the various cavities that the lid defines are electrically isolated to a high degree from one another. The narrow width of the central RF channel creates a waveguide beyond cutoff for the operating frequencies, providing high isolation between the RE input and the output.

The alumina substrate is attached to the baseplate preform and the lid by epoxy preforms for ease of assembly and to mitigate the effects of thermal expansion mismatch between the baseplate, alumina substrate, and the lid.

Figure 4A:
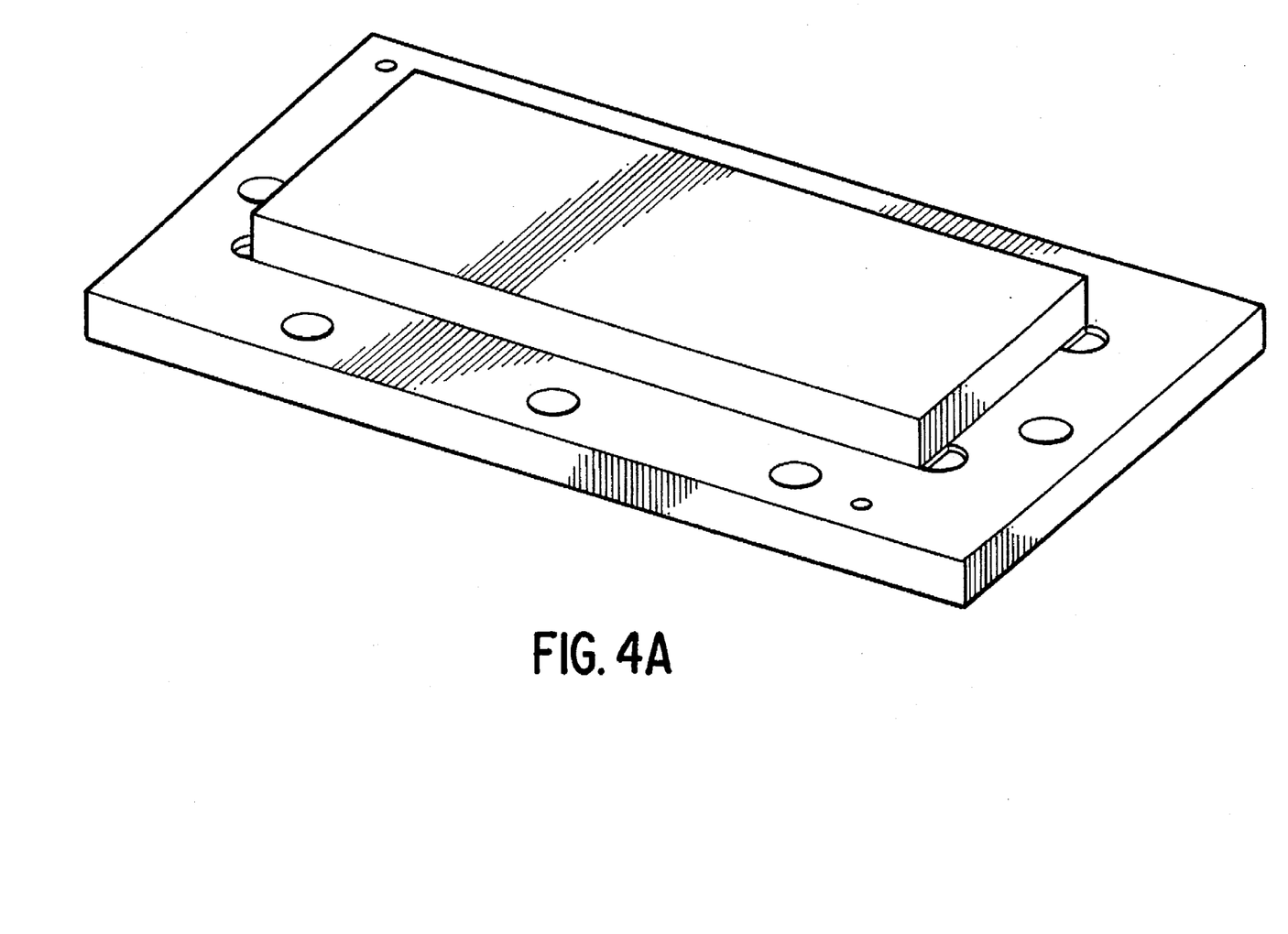
FIGS. 4A-C illustrate a fully assembled module.
Figure 4B:
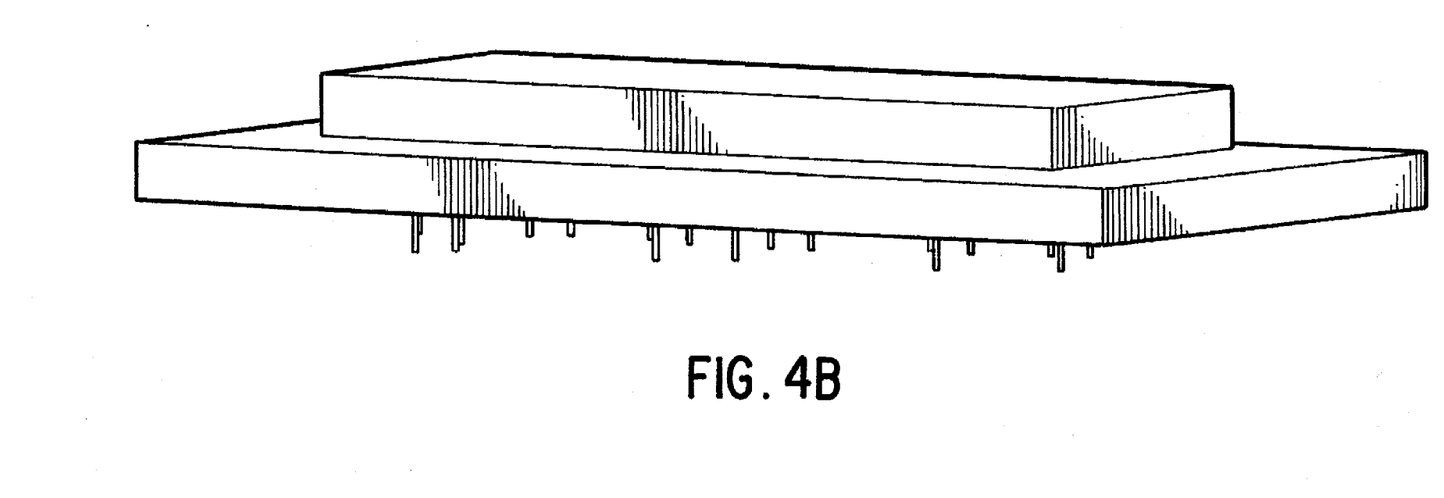
Figure 4C:
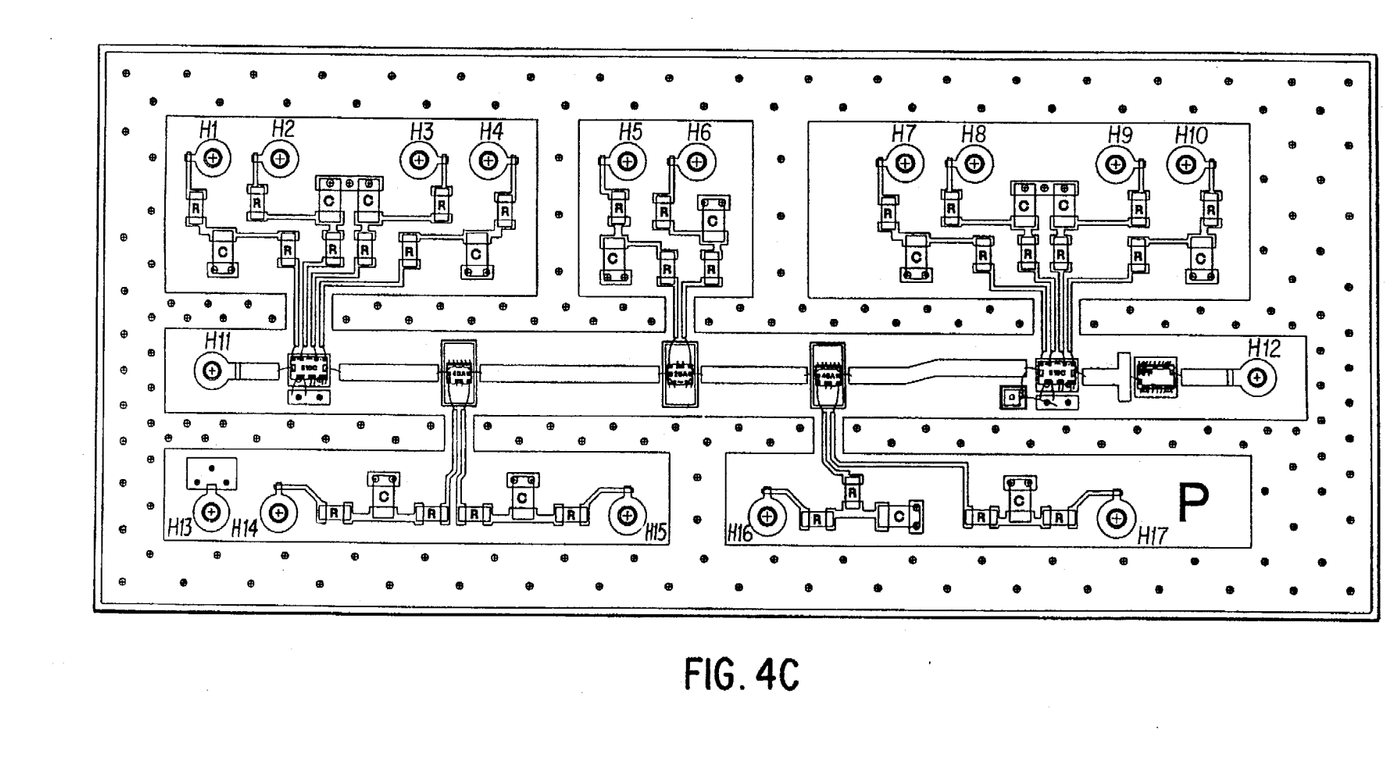

FIGS. 4A-C illustrate a fully assembled module. An advantage of the packaging assembly is that there already exists many zero insertion force sockets for the testing of PGA packages. By designing the assemblies correctly, they can be made to be completely compatible with these sockets, and can be functionally tested up to 200 MHZ quite accurately and quickly.

After assembly, the packaging assembly is bolted to a PC board. A first electrically conductive conformable gasket is placed between the packaging assembly and the PC board to provide a continuous grounding connection between the top of the PC board and the bottom of the assembly. The PGA pins of the circuit assembly are soldered on the backside of the PC board where they protrude through. A backplate which is threaded to accept SMA connectors if any are required is then bolted to the back of the PC board with a second electrically conductive conformable gasket between it and the PC board. RF signals can be brought into the module on shielded inner layer traces of the PC board if high isolation is required.

I claim:

1. A packaging assembly comprising:

a baseplate of electrical conductive material;

a circuit assembly having pins, having a top and a bottom ground plane that are electrically connected;

a baseplate preform of electrically conductive material, positioned between the baseplate and the circuit assembly, being operative to accommodate differential thermal expansion and electrically connect the baseplate and the bottom ground plane of the circuit assembly;

a lid of electrically conductive material; and a lid preform of electrically conductive material, positioned between the circuit assembly and the lid, to accommodate differential thermal expansion and electrically connect the top ground plane of the circuit assembly to the lid.

2. A packaging assembly, as defined in claim 1, the baseplate comprising a metal ground plane that electrically isolates the pins of the circuit assembly.

3. A low cost microwave package comprising:

a packaging assembly that includes, a baseplate of electrically conductive material, a circuit assembly having pins, having a top and bottom ground plane that are electrically connected, a baseplate preform of electrically conductive material, positioned between the baseplate and the circuit assembly, being operative to accommodate differential thermal expansion and electrically connect the baseplate and the bottom ground plane of the circuit assembly, a lid of electrically conductive material, and a lid preform of electrically conductive material, positioned between the circuit assembly and the lid, to accommodate differential thermal expansion and electrically connect the top ground plane of the circuit assembly and the lid, a substrate having holes, wherein the packaging assembly is positioned on the substrate and the pins protrude through the holes;

a first conformable gasket that is electrically conductive, positioned between the substrate and the packaging assembly being operative to provide a continuous grounding connection between the PC board and the circuit assembly;

an array of solder operative to secure the pins to the substrate;

a backplate, attached to the substrate; and a second conformable gasket that is electrically conductive, positioned between the substrate and the backplate.

4. A low cost microwave package, as defined in claim 3, the baseplate comprising a metal ground plane that electrically isolate the pins of the circuit assembly.

* * * * *

UNITED STATES PATENT AND TRADEMARK OFFICE
CERTIFICATE OF CORRECTION

PATENT NO. : 5,668,408
DATED : September 16, 1997
INVENTOR(S) : Dean B. Nicholson It is certified that error appears in the above-identified patent and that said Letters Patent is hereby corrected as shown below:

Column 2, line 61 "the RE input and the output." should read -- the RF input and the output. --

Signed and Sealed this

Twentieth Day of January, 1998

Attest:

BRUCE LEHMAN

*Attesting Officer*  *Commissioner of Patents and Trademarks*